United States Patent
Hwang

(10) Patent No.: US 10,109,362 B2
(45) Date of Patent: Oct. 23, 2018

(54) SEMICONDUCTOR DEVICE AND METHOD FOR OPERATING THE SAME

(71) Applicant: SK hynix Inc., Gyeonggi-do (KR)

(72) Inventor: Jeong-Tae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/612,662

(22) Filed: Jun. 2, 2017

(65) Prior Publication Data

US 2018/0108424 A1    Apr. 19, 2018

(30) Foreign Application Priority Data

Oct. 17, 2016 (KR) ........................ 10-2016-0134232

(51) Int. Cl.
  *G11C 17/16* (2006.01)
  *G11C 17/08* (2006.01)
  *G11C 17/18* (2006.01)

(52) U.S. Cl.
  CPC .............. *G11C 17/16* (2013.01); *G11C 17/08* (2013.01); *G11C 17/18* (2013.01)

(58) Field of Classification Search
  CPC .......... G11C 17/16; G11C 17/08; G11C 17/18
  See application file for complete search history.

(56) References Cited

U.S. PATENT DOCUMENTS

| 2014/0126317 A1* | 5/2014 | Kwon | G11C 17/16 365/207 |
| 2014/0126318 A1* | 5/2014 | Jeong | G11C 17/18 365/225.7 |
| 2016/0099075 A1* | 4/2016 | Yoon | G11C 17/18 365/96 |
| 2016/0181260 A1* | 6/2016 | Lee | H01L 27/11206 365/96 |
| 2017/0243660 A1* | 8/2017 | Kim | G11C 17/16 |

FOREIGN PATENT DOCUMENTS

| KR | 100145227 | 12/1996 |
| KR | 1020050109219 | 11/2005 |
| KR | 1020100129075 | 12/2010 |

* cited by examiner

*Primary Examiner* — Tri Hoang
(74) *Attorney, Agent, or Firm* — IP & T Group LLP

(57) ABSTRACT

A semiconductor device includes a fuse array section suitable for performing program and read operations; a control signal generation section suitable for generating a precharge control signal and a word line control signal; a bit line control section suitable for controlling a precharge operation of a bit line in response to the precharge control signal and a source signal; and a word line control section suitable for controlling activation of a program word line and a read word line for performing the program and read operations in response to the word line control signal, wherein the control signal generation section controls the word line control signal to be activated after a predetermined time from the activation of the precharge control signal.

16 Claims, 5 Drawing Sheets

SEMICONDUCTOR DEVICE AND METHOD FOR OPERATING THE SAME

CROSS-REFERENCE TO RELATED APPLICATIONS

The present application claims priority under 35 U.S.C 119(a) to Korean Patent Application No. 10-2016-0134232, filed on Oct. 17, 2016, which is incorporated herein by reference in its entirety.

BACKGROUND

1. Field

Exemplary embodiments of the present invention relate generally to a semiconductor design technology and, more particularly, to a semiconductor device capable of controlling a read operation and a precharge operation of a fuse array, and a method for operating the semiconductor device.

2. Description of the Related Art

In general, a semiconductor device such as a double data rate synchronous dynamic random access memory (DDR SDRAM) includes a fuse circuit. The fuse circuit may store various pieces of information to be used for the circuit operation of the semiconductor device. For example, the fuse circuit may store various result values obtained through a test operation on the semiconductor device, and the semiconductor device uses the result values stored in the fuse circuit when performing a circuit operation. Accordingly, even though the characteristics of new semiconductor memory devices are slightly different from each other, all the semiconductor memory devices may perform substantially the same operation based on information stored in the fuse circuit. Consequently, the fuse circuit serves as the basis for providing an environment in which a number of semiconductor devices may perform substantially the same operation.

Hereinafter, a brief description of a typical a fuse circuit is provided.

The fuse circuit includes a plurality of fuses in which various pieces of information are stored. For the sake of convenience in description, a series of operations for storing particular information in a fuse is referred to as a "program operation". A method for programming particular information in a fuse may be classified as a physical or an electrical method.

A physical method includes cutting a fuse by blowing the fuse using a laser beam, and the like, according to information to be programmed. The fuse used in the physical method is referred to as a physical fuse. Since the laser beam is used to cut the connection state of the fuse, the fuse is also referred to as a laser blowing fuse. The physical fuse may be programmed only in a wafer stage before a semiconductor device is packaged. Hence, the physical fuse may not be programmed after the wafer stage.

The electrical method includes changing the connection state of a fuse by applying an overcurrent to the fuse based on information to be programmed. The fuse used in the electrical method is referred to as an electrical fuse. The electrical fuse may be classified into anti-type fuses and blowing type fuses. When being programmed, the anti-type fuse changes from an initial open state to a short state and the blowing type fuse changes from an initial short state to an open state. Such electrical fuse is advantageous over the physical fuse in that the program operations are possible after the wafer state, that is, even in a package state. Accordingly, recent trends have shown that the electrical method is preferred to the physical method in designing a semiconductor device.

A semiconductor device is designed to perform various operations required by consumers. Performing various operations means an increase in the number of fuses for storing the information for the various operations. Recently substantial research has been targeted to improved technologies for efficiently managing a larger number of fuses. One such technology is the fuse array circuit technology.

FIG. 1 illustrates a conventional fuse array circuit. Referring to FIG. 1, the fuse array circuit has a plurality of fuse memory cells disposed in an array form. Hereinafter, for the sake of convenience in description, one fuse cell 110 of the fuse memory cells is described.

The fuse cell 110 includes a fuse F and a selection transistor TR. The fuse F is coupled to a program word line WLP1 and the selection transistor TR is coupled to a read word line WLR1. The fuse F stores information and may be designed using various types of fuses, as described above.

Hereinafter, a simple read operation of the fuse array circuit will be described. For convenience, it is assumed that the fuse array circuit stores predetermined information through a program operation.

In a read operation for outputting information programmed in the fuse F, a predetermined constant voltage is applied to the program word line WLP1 and the read word line WLR1. Then, a bit line BL1 may have a voltage level corresponding to the information programmed in the fuse F. That is, when the fuse F is in an open state, the bit line BL1 substantially maintains a precharged voltage, and when the fuse F is in a short state, since the predetermined voltage is transferred to the bit line BL1 via the fuse F and the selection transistor TR, the bit line BL1 is driven to a voltage level corresponding to the predetermined voltage. Although not illustrated in the drawing, a circuit for detecting and outputting the voltage level of the bit line BL1 in the read operation is coupled to the bit line BL1. As a result, the information programed in the fuse F is outputted through the bit line BL1 so that the semiconductor device performs a predetermined circuit operation using the outputted information.

As described above, the fuse F may enter the open state or the short state through the program operation. Ideally, a fuse F in the open state and a fuse F in the short state should have constant resistance values respectively. However actual resistance values of fuses F may be slightly different from each other. Accordingly, sensing (or detecting) operation timing may be set based on an assumption that the fuses F have the worst possible resistance value.

Furthermore, as described above, in a read operation of the fuse F, a predetermined constant voltage is applied to the program word line WLP1 and the read word line WLR1. In general, after the predetermined constant voltage is applied to the program word line WLP1 and the read word line WLR1, a read operation and a precharge operation may be performed together. However, when the read operation is performed together with the precharge operation, a drain-source voltage Vds of the selection transistor TR may greatly increase. In this case, a corresponding transistor may malfunction because of the negative influence on the reliability of the transistor.

SUMMARY

Various embodiments of the present invention are directed to a semiconductor device having a fuse array wherein the semiconductor device is capable of controlling when a bias is applied to a program word line and a read word line in a read operation of a fuse array.

In accordance with an embodiment of the present invention, a semiconductor device includes: a fuse array section suitable for performing program and read operations; a control signal generation section suitable for generating a precharge control signal and a word line control signal; a bit line control section suitable for controlling a precharge operation of a bit line in response to the precharge control signal and a source signal; and a word line control section suitable for controlling activation of a program word line and a read word line for performing the program and read operations in response to the word line control signal, wherein the control signal generation section controls the word line control signal to be activated after a predetermined time from the activation of the precharge control signal.

The control signal generation section may include: a precharge control signal generation block suitable for generating the precharge control signal and an enable signal for controlling the precharge operation of the bit line; a source signal generation block suitable for generating the source signal for controlling a word line and the bit line in response to the enable signal and a rupture command signal; and a word line control signal generation block suitable for generating the word line control signal for controlling the activation of the program word line and the read word line in response to the source signal and a precharge signal and generating a precharge initialization signal for initializing the precharge operation.

The word line control signal generation block may generate the precharge initialization signal for initializing the precharge operation by delaying the source signal by a predetermined period of time.

The semiconductor device may further include: a bit line precharge control section suitable for generating the precharge signal for the precharge operation of the bit line in response to the precharge control signal and the precharge signal.

The bit line control section may generate a bit line precharge driving signal for precharging the bit line and a bit line selection signal in response to the bit line precharge signal and the source signal.

The fuse array section may perform the precharge operation of the bit line in response to the bit line selection signal and the bit line precharge driving signal and performs the program and read operations based on the activation of the program word line and the read word line.

The word line control signal generation block may include: a signal delay unit suitable for generating a first output signal for controlling the word line control signal by delaying the source signal by the predetermined period of time and generating the precharge initialization signal by additionally delaying the first output signal by a predetermined period of time.

The fuse array section may include: a fuse cell suitable for performing the program and read operations in response to a bias applied to the program word line and the read word line; a bit line selection block suitable for selecting a corresponding bit line in response to the bit line selection signal; a sense amplification block suitable for sensing data loaded on the bit line based on a reference voltage in response to a sense amplification enable signal; and a precharge block suitable for precharging the bit line with a ground voltage in response to the bit line precharge driving signal.

The bit line precharge driving signal may be activated before the bias is applied to the program word line and the read word line.

The fuse cell may include: a fuse suitable for storing predetermined information in the program operation and outputting the stored information in the read operation; and a selection transistor suitable for selecting the fuse.

A drain-source voltage of the selection transistor floats in the read operation of the fuse cell.

In accordance with an embodiment of the present invention, a method for operating a semiconductor device includes: generating a bit line precharge driving signal for controlling a precharge operation of a bit line; performing the precharge operation of the bit line in response to the bit line precharge driving signal; generating a word line control signal after the precharge operation of the bit line; applying a bias to a program word line and a read word line in response to the word line control signal; and performing a read operation of a fuse array in response to the bias applied to the program word line and the read word line.

The generating of the bit line precharge driving signal may include: generating a precharge control signal and an enable signal in response to a read command and a verification read command; generating a precharge signal in response to the precharge control signal and a precharge initialization signal; and generating the bit line precharge driving signal in response to the precharge signal and a source signal.

The method may further include: generating a bit line selection signal for selecting the bit line in response to the precharge signal and the source signal.

The generating of the word line control signal may include: generating the source signal in response to the enable signal and a rupture command; and generating the word line control signal activated after the precharge operation in response to the source signal and the precharge signal.

The performing of the read operation of the fuse array may include: applying a read voltage to the program word line of a fuse selected based on activation of the read word line; and sensing a current flowing through a bit line coupled to a fuse of the bit line selected based on the bit line selection signal.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. However, we note that the embodiments presented are merely examples of the invention and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first," "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 1:
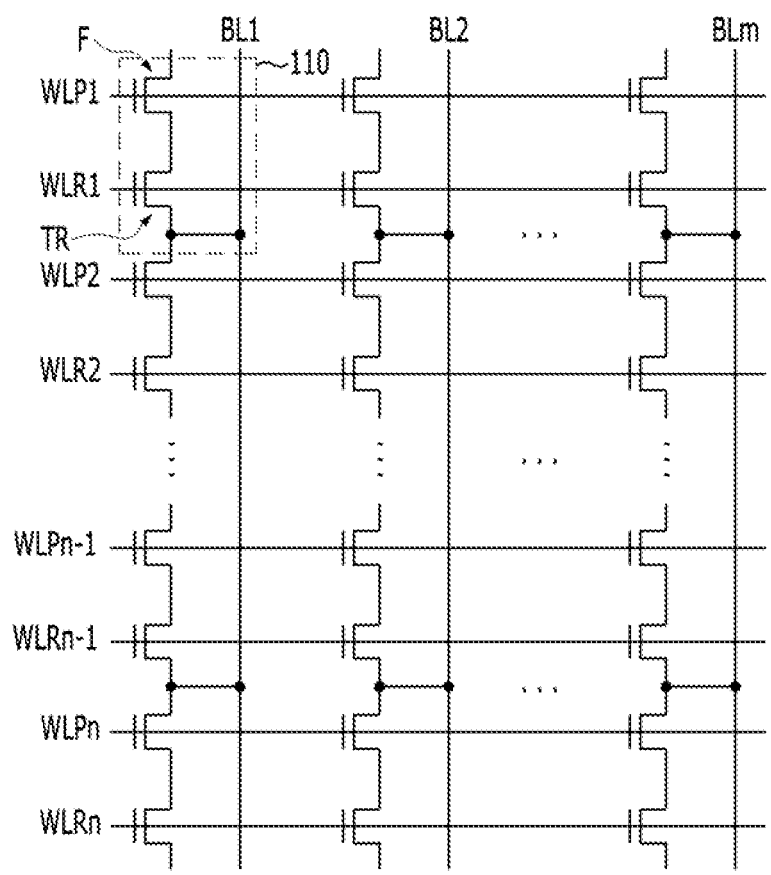
FIG. 1 is a diagram illustrating a conventional fuse array circuit.
Figure 2:
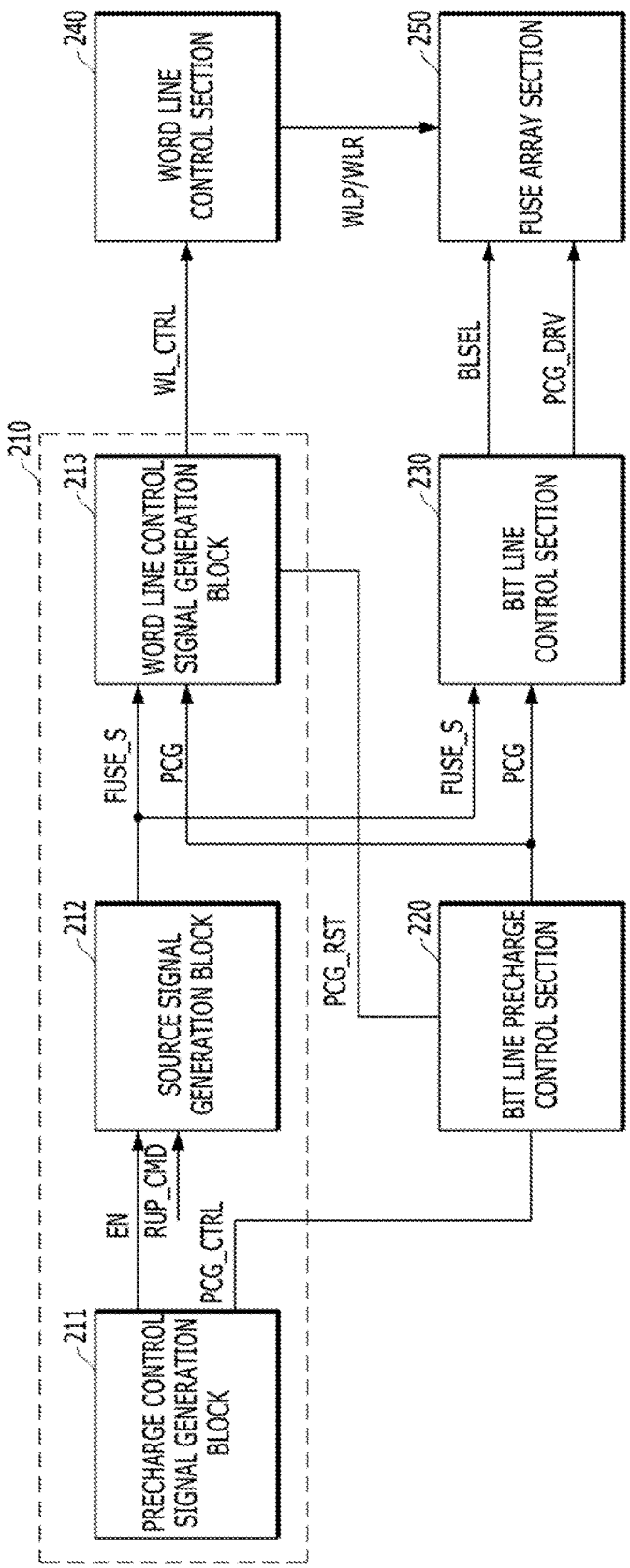
FIG. 2 is a block diagram illustrating a semiconductor device in accordance with an embodiment of the present invention.

FIG. 2 is a block diagram illustrating a semiconductor device in accordance with an embodiment of the present invention.

Referring to FIG. 2, the semiconductor device may include a control signal generation section 210, a bit line precharge control section 220, a bit line control section 230, a word line control section 240, and a fuse array section 250.

The control signal generation section 210 may include a precharge control signal generation block 211, a source signal generation block 212, and a word line control signal generation block 213.

The precharge control signal generation block 211 may receive a plurality of commands and control signals not illustrated) from an external device to generate a precharge control signal PCG_CTRL for controlling a precharge operation and an enable signal EN in a read operation of a fuse.

The commands may include commands for the read operation and a verification read operation. The control signals may include a boot-up signal, an initialization signal of the fuse and an oscillator, and the like.

The source signal generation block 212 may generate a source signal FUSE_S for controlling a word line and a bit line in response to the enable signal EN and a rupture command RUP_CMD. In other words, the source signal FUSE_S may designate a position of the fuse.

The word line control signal generation block 213 may generate a word line control signal WL_CTRL for controlling program and read operations of the word line in response to the source signal FUSE_S and a precharge signal PCG. The precharge signal PCG may be generated by the bit line precharge control section 220, as described below.

The bit line precharge control section 220 may generate the precharge signal PCG for performing a precharge operation of the bit line in response to the precharge control signal PCG_CTRL received from the precharge control signal generation block and a precharge initialization signal PCG_RST received from the word line control signal generation block.

The bit line control section 230 may generate a bit line selection signal BLSEL for selecting a bit line and a bit line precharge driving signal PCG_DRV in response to the source signal FUSE_S received from the source signal generation block 212 and the precharge signal PCG received from the bit line precharge control section 220. The bit line selection signal BLSEL may be a signal for selecting a bit line to perform a read operation from a plurality of bit lines. The bit line precharge driving signal PCG_DRV may be a signal for performing the precharge operation of the bit line as the same signal to the precharge signal PCG. In other words, the precharge signal PCG may be outputted as the bit line precharge driving signal PCG_DRV by the bit line control section 230.

The word line control section 240 may control the timing of activating a program word line WLP and a read word line WLR for controlling the program and read operations in response to the word line control signal WL_CTRL. The program word line WLP and the read word line WLR may be activated after a precharge operation period terminates.

The fuse array section 250 may perform the program and read operations in response to the program word line WLP, the read word line WLR, the bit line selection signal BLSEL and the bit line precharge driving signal PCG_DRV.

Hereinafter, the read operation of the semiconductor device will be described. For illustrative purposes, as an example, it is assumed that predetermined information is stored in the fuse array section 250 through a program operation.

The precharge control signal PCG_CTRL may be generated by the precharge control signal generation block 211 and the precharge signal PCG may be generated based on the precharge control signal PCG_CTRL and the precharge initialization signal PCG_RST. The precharge signal PCG may be activated before the program word line WLP and the read word line WLR are activated, thereby performing the precharge operation of the bit line in advance. Subsequently, the precharge operation may be performed and the word line control signal WL_CTRL may be generated so that a constant voltage is applied to the program word line WLP and the read word line WLR. Hence, the program word line WLP and the read word line WLR may be activated and from then on, the read operation of the fuse may be performed.

Figure 3:
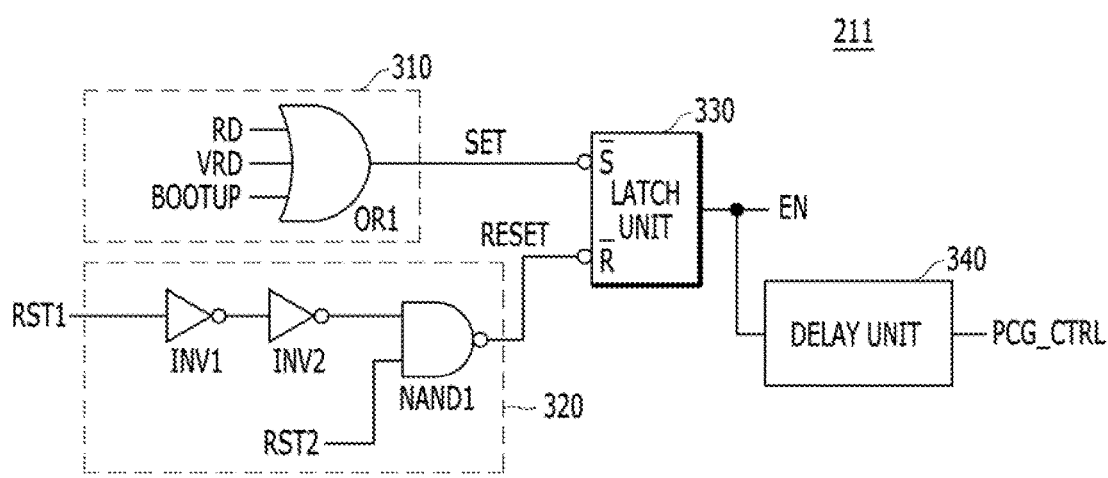
FIG. 3 is a diagram illustrating an exemplary configuration o a precharge control signal generation block shown in FIG. 2.

FIG. 3 is a diagram illustrating the precharge control signal generation block 211 shown in FIG. 2.

Referring to FIG. 3, the precharge control signal generation block 211 may include a set signal generation unit 310 a reset signal generation unit 320, a latch unit 330, and a delay unit 340.

The set signal generation unit 310 may generate a set signal SET for performing a set operation of the latch unit 330 in response to a read command RD, a verification read command VRD and a boot-up signal BOOTUP. The set signal generation unit 310 may be formed of an OR gate OR1. When at least one of the read command RD, the verification read command VRD and the boot-up signal BOOTUP is activated, the set signal generation unit 310 may generate the set signal SET.

The read command RD may be received from an external device in order to read fuse information. The verification read command VRD may be a command for a verification operation in an internal read operation of a fuse rupture operation. The boot-up signal BOOTUP may be an operation pulse signal, which activates loading of the fuse.

The reset signal generation unit 320 may generate a reset signal RESET for performing a reset operation of the latch unit 330 in response to a first initialization signal RST1 and a second initialization signal RST2. The reset signal generation unit 320 may be formed to include first and second inverters INV1 and INV2 and a first NAND gate NAND1. The first initialization signal RST1 may be delayed by the first and second inverters INV1 and INV2 during a predetermined time and outputted to the first NAND gate NAND. The first NAND gate NAND1 may perform a logic operation on the first initialization signal RST1 and the second initialization signal RST2 and output the reset signal RESET.

The first initialization signal RST1 may be an inverted signal of a signal for initializing an oscillator and the second initialization signal RST2 may be an inverted signal of a signal for initializing the fuse.

The latch unit 330 may generate an oscillation enable signal EN that is activated in response to the set signal SET and deactivated in response to the reset signal RESET.

The delay unit 340 may delay the oscillation enable signal EN by a predetermined period of time to generate the precharge control signal PCG_CTRL for performing the precharge operation. The precharge control signal PCG_CTRL may be activated for the precharge operation in the read operation of the fuse.

Figure 4:
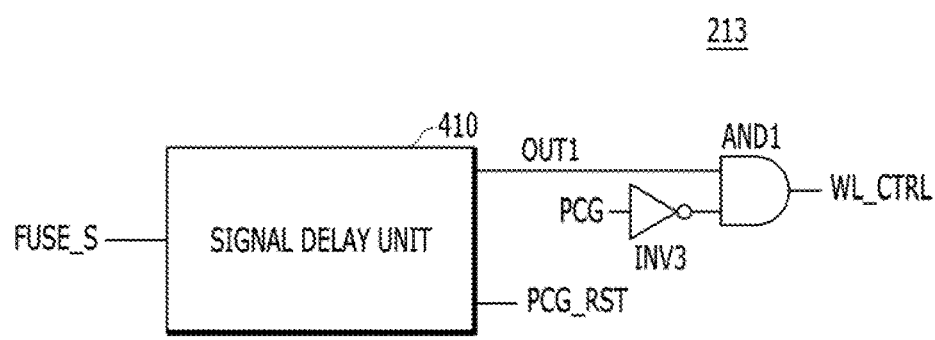
FIG. 4 is a diagram illustrating an exemplary configuration of a word line control signal generation block shown in FIG. 2.

FIG. 4 is a diagram illustrating the word line control signal generation block 213 shown in FIG. 2.

Referring to FIG. 4, the word line control signal generation block 213 may include a signal delay unit 410.

The signal delay unit 410 may be formed of an inverter delay circuit for delaying the source signal FUSE_S. The signal delay unit 410 may delay the source signal FUSE_S by a predetermined time and output the delayed signal as an output signal OUT1. Also, the signal delay unit 410 may delay the output signal OUT1 by additionally delaying by a predetermined time and output the delayed signal as the precharge initialization signal PCG_RST. In other words, the output signal OUT1 and the precharge initialization signal PCG_RST may be outputted based on the degree of delay of the source signal FUSE_S.

The output signal OUT1 may be outputted to a first AND gate AND1. The first AND gate AND1 may perform a logic operation on a signal obtained by inverting the precharge signal PCG through a third inverter INV3 and the output signal OUT1 and output as the word line control signal WL_CTRL.

Figure 5:
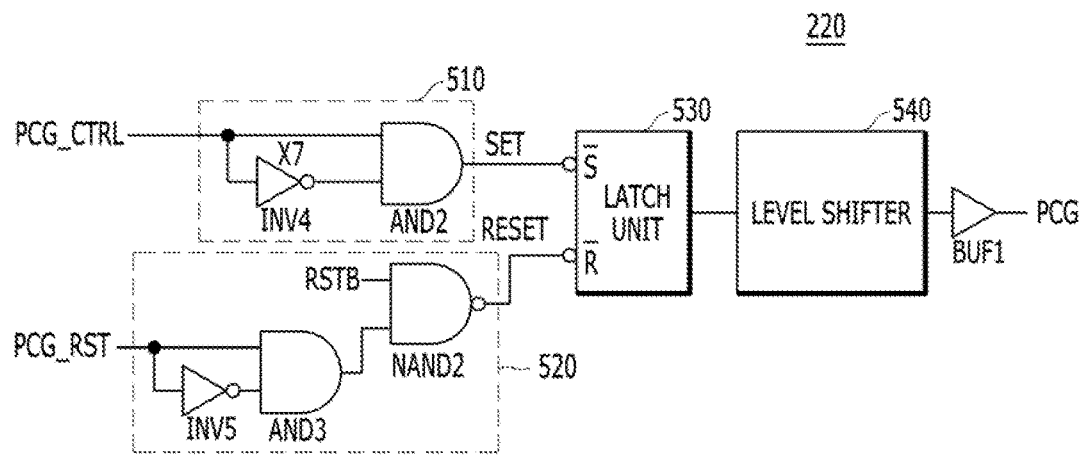
FIG. 5 is a diagram illustrating an exemplary configuration of a bit line precharge control section shown in FIG. 2.

FIG. 5 is a diagram illustrating the bit line precharge control section 220 shown in FIG. 2.

Referring to FIG. 5, the bit line precharge control section 220 may include a set signal generation unit 510, a reset signal generation unit 520, a latch unit 530, and a level shifter 540.

The set signal generation unit 510 may receive the precharge control signal PCG_CTRL and generate a set signal SET capable of setting the latch unit 530. The set signal generation unit 510 may be formed to include a plurality of inverters INV4 and a second AND gate AND2.

The reset signal generation unit 520 may receive the precharge initialization signal PCG_RST and a third initialization signal RSTB and generate a reset signal RESET for resetting the latch unit 530. The reset signal generation unit 520 may be formed to include a fifth inverter INV5, a third AND gate AND3 and a second NAND gate NAND2.

The precharge initialization signal PCG_RST, as a signal generated by the word line control section 210, may be a signal obtained by delaying the source signal FUSE_S by a predetermined period of time. The third initialization signal RSTB may be a signal for initializing the semiconductor device.

The latch unit 530 may output an input signal (not illustrated) of the level shifter 540 in response to the set signal SET and the reset signal RESET. The input signal of the level shifter 540 may be activated in response to the set signal SET and deactivated in response to the reset signal RESET.

The level shifter 540 may boost a voltage level of the input signal to a high voltage VPP level and output the boosted voltage.

An output signal (not illustrated) whose voltage level is boosted through the level shifter 540 may be buffered through a first buffer BUF1 and outputted as the precharge signal PCG. The precharge signal PCG may be a signal for performing the precharge operation of the bit line in the read operation of the fuse.

Figure 6:
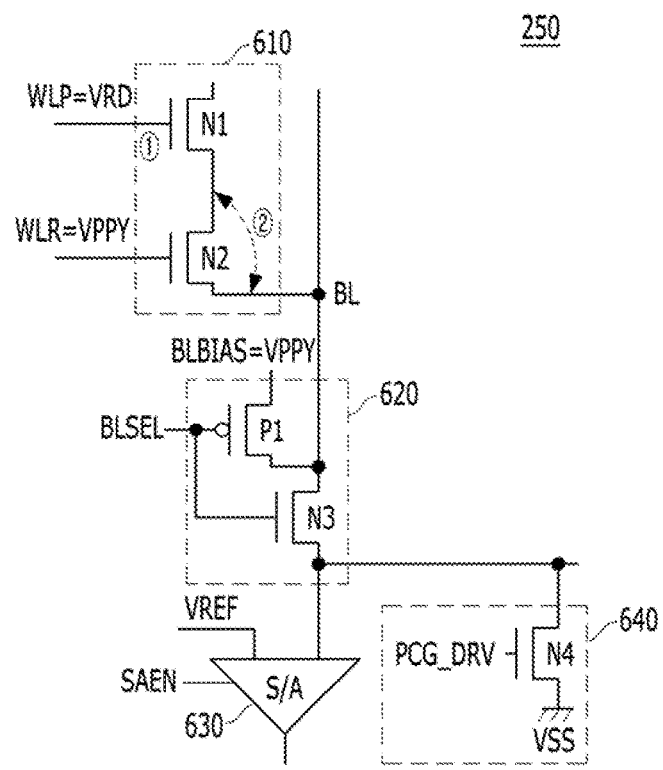
FIG. 6 is a diagram illustrating an exemplary configuration of a fuse array section shown in FIG. 2.

FIG. 6 is a diagram illustrating the fuse array section 250 shown in FIG. 2.

Referring to FIG. 6, the fuse array section 250 may include a fuse cell 610, a bit line selection block 620, a sense amplification (S/A) block 630, and a precharge block 640.

The fuse cell 610 may include first and second NMOS transistors N1 and N2. The first NMOS transistor N1 may be a fuse as a target for being programmed and be coupled to the program word line WLP. The first NMOS transistor N1 may be designed to be various types of fuses for storing information.

The second NMOS transistor N2 may be a selection transistor and be coupled to the read word line WLR.

The bit line selection block 620 may include a first PMOS transistor P1 and a third NMOS transistor N3. The bit line selection block 620 may select a corresponding bit line in response to the activation of the bit line selection signal BLSEL.

The sense amplification block 630 may sense and output data loaded on the bit line BL based on a reference voltage VREF in response to a sense amplification enable signal SAEN.

The precharge block 640 may include a fourth NMOS transistor N4 and precharge the bit line BL in response to the bit line precharge driving signal PCG_DRV. When the bit line precharge driving signal PCG_DRV is enabled, the precharge operation may be performed by causing a short circuit between the bit line BL and a ground voltage VSS.

Hereinafter, a read operation among the operations of the fuse array section 250 will be described. For illustrative purposes, as an example, it is assumed that predetermined information is stored in the fuse array section 250 through a program operation.

When the read operation is performed, the bit line selection signal BLSEL may be activated and the third NMOS transistor N3 may be turned on. The bit line precharge driving signal PCG_DRV may be generated by the bit line control section 230 and may be activated, and the bit line BL may be precharged to a ground voltage VSS level. The bit line precharge driving signal PCG_DRV may be activated during a predetermined time. When the precharge signal PCG is deactivated, the sense amplification enable signal SAEN may be activated. Subsequently, a predetermined voltage may be applied to the program word line WLP and the read word line WLR, and the first and second NMOS transistors N1 and N2 may be turned on.

In other words, in the read operation for outputting information programmed in the first NMOS transistor N1, respective predetermined voltages may be applied to the program word line WLP and the read word line WLR. For example, a read voltage VRD may be applied to the program word line WLP and a high voltage VPPY may be applied to the read word line WLR. Then, a voltage level of the bit line BL may be determined based on the information programmed in the first NMOS transistor N1. Accordingly, the data loaded on the bit line BL selected in response to the bit line selection signal BLSEL may be outputted based on a sensing operation of the sense amplification block 630.

That is, in the read operation of the fuse the information programmed in the first NMOS transistor N1, which is the fuse, may be outputted through the bit line BL and the semiconductor device may perform an internal circuit operation using the outputted information.

Figure 7A:
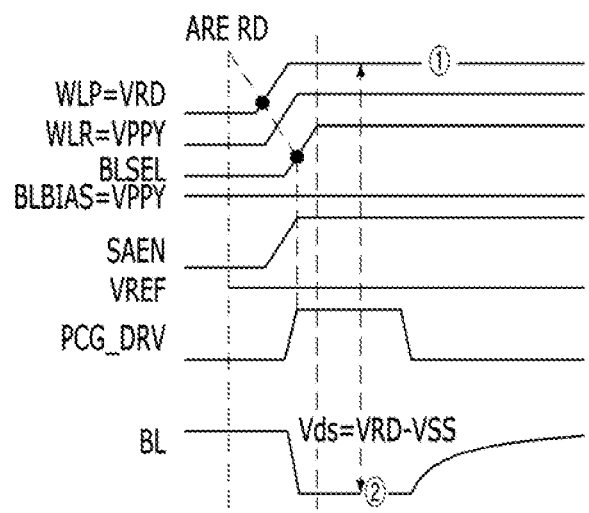
FIGS. 7A and 7B are timing diagrams illustrating an operation of the fuse array section shown in FIG. 6, in accordance with an embodiment of the present invention.
Figure 7B:
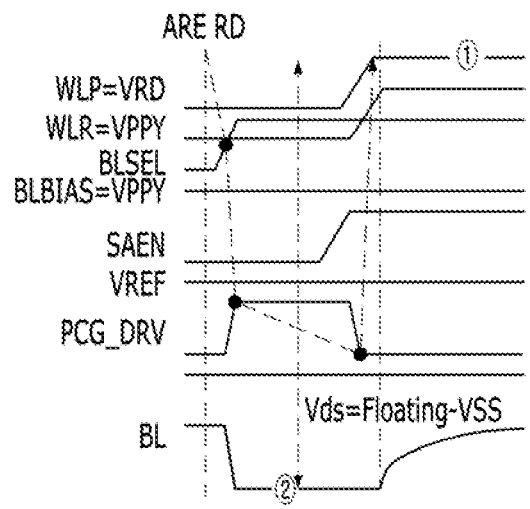

FIGS. 7A and 7B are timing diagrams illustrating the operation of the fuse array section 250 shown in FIG. 6. FIG. 7A is a timing diagram illustrating an operation according to a comparative example in which the program word line WLP and the read word line WLR are activated first regardless of the activation of the precharge signal PCG in the read operation of the fuse. FIG. 7B is a timing diagram illustrating an operation to control the activation of the program word line WLP and the read word line WLR according to an embodiment of the present invention.

Referring to FIG. 7A, when the read operation ARE RD of the fuse is performed, respective voltage levels may be applied to the program word line WLP and the read word line WLR. Hence, the bit line selection signal BLSEL may be activated and subsequently, the sense amplification enable signal SAEN may be activated. Consequently, it may be seen that the bit line precharge driving signal PCG_DRV for the precharge operation is activated.

The first NMOS transistor N1, i.e., the fuse may have a minimum resistance value with 0 ohm while the predetermined information are stored through the program operation. On a basis of this, a voltage level of the read voltage VRD may be set to be substantially high in order to supply sufficient current to the program word line WLP. Under the circumstances, the second NMOS transistor N2, i.e., the read word line WLR may be placed in a worst condition in terms of the reliability of the transistor. In other words, a slim-based transistor may be used for the second NMOS transistor N2. When the drain-source voltage Vds becomes high, a phenomenon such as a punch may occur in channels of the slim-based second NMOS transistor N2 being affected by the reliability of the transistor. Thus, a corresponding transistor may have an ill condition.

As a result, the program operation may be controlled not to incur the condition where the drain-source voltage Vds becomes a maximum read voltage VRD. Since the fuse array section 250 according to the comparative example performs the precharge operation after the bit line BL is selected in a condition where a bias is already applied to the first and second NMOS transistors N1 and N2, the second NMOS transistor N2 may deteriorate whenever the read operation is performed. In order to alleviate such a, the precharge operation of the bit line BL may be controlled to be performed before the bias is applied to the program word line WLP and the read word line WLR in accordance with the embodiment of the present invention, which will be described with reference to FIG. 7B below.

Referring to FIG. 7B, when the read operation ARE RD of the fuse is performed, the bit line precharge driving signal PCG_DRV may be activated so that the precharge operation is controlled to be performed before the bias is applied to the program word line WLP and the read word line WLR. In other words, after the precharge operation of the bit line BL is completed based on the precharge signal PCG, it may be seen that the respective predetermined voltage levels are applied to the program word line WLP and the read word line WLR. Accordingly, since the drain-source voltage Vds of the selection transistor, which is the second NMOS transistor N2 coupled to the read word line WLR, meets a floating condition, the reliability of the semiconductor device may be secured.

To sum up, when the predetermined information is stored in the first NMOS transistor N1, which is the fuse, through the program operation and the read operation is performed to output the information, the predetermined voltage levels may be applied to the program word line WLP and the read word line WLR so that the read operation is performed to meet the condition that the drain-source voltage Vds of the second NMOS transistor N2, which is the selection transistor, floats after the precharge operation of the bit line BL is completed. As a result, the reliability of the semiconductor device may be secured.

While the present invention has been described with respect to specific embodiments, the embodiments are not intended to be restrictive, but rather descriptive. Further, it is noted that the present invention may be achieved in various ways through substitution, change, and modification, by those skilled i n the art without departing from the spirit and/or scope of the present invention as defined by the following claims.

What is claimed is:
1. A semiconductor device, comprising:
   a fuse array section suitable for performing program and read operations;
   a control signal generation section suitable for generating a precharge control signal and a word line control signal;

a bit line control section suitable for controlling a precharge operation of a bit line in response to the precharge control signal and a source signal; and a word line control section suitable for controlling activation of a program word line and a read word line for performing the program and read operations in response to the word line control signal, wherein the control signal generation section controls the word line control signal to be activated after a predetermined time from the activation of the precharge control signal.

2. The semiconductor device of claim 1, wherein the control signal generation section includes:

a precharge control signal generation block suitable for generating the precharge control signal and an enable signal for controlling the precharge operation of the bit line;

a source signal generation block suitable for generating the source signal for controlling a word line and the bit line in response to the enable signal and a rupture command signal; and a word line control signal generation block suitable for generating the word line control signal for controlling the activation of the program word line and the read word line in response to the source signal and a precharge signal and generating a precharge initialization signal for initializing the precharge operation.

3. The semiconductor device of claim 2, where the word line control signal generation block generates the precharge initialization signal for initializing the precharge operation by delaying the source signal by a predetermined period of time.

4. The semiconductor device of claim 2, further comprising:

a bit line precharge control section suitable for generating the precharge signal for the precharge operation of the bit line in response to the precharge control signal and the precharge initialization signal.

5. The semiconductor device of claim 4, wherein the bit line control section generates a bit line precharge driving signal for precharging the bit line and a bit line selection signal in response to the bit line precharge signal and the source signal.

6. The semiconductor device of claim 5, wherein the fuse array section performs the precharge operation of the bit line in response to the bit line selection signal and the bit line precharge driving signal and performs the program and read operations based on the activation of the program word line and the read word line.

7. The semiconductor device of claim 2, wherein the word line control signal generation block includes:

a signal delay unit suitable for generating a first output signal for controlling the word line control signal by delaying the source signal by a first predetermined period of time and generating the precharge initialization signal by additionally delaying the first output signal by a second predetermined period of time.

8. The semiconductor device of claim 6, wherein the fuse array section includes:

a fuse cell suitable for performing the program and read operations in response to biases applied to the program word line and the read word line;

a bit line selection block suitable for selecting a corresponding bit line in response to the bit line selection signal;

a sense amplification block suitable for sensing data loaded on the bit line based on a reference voltage in response to a sense amplification enable signal; and a precharge block suitable for precharging the bit line with a ground voltage in response to the bit line precharge driving signal.

9. The semiconductor device of claim 8, wherein the bit line precharge driving signal is activated before the biases are applied to the program word line and the read word line.

10. The semiconductor device of claim 8, wherein the fuse cell includes:

a fuse suitable for storing predetermined information in the program operation and outputting the stored information in the read operation; and a selection transistor suitable for selecting the fuse.

11. The semiconductor device of claim 10, wherein a drain-source voltage of the selection transistor floats in the read operation of the fuse cell.

12. A method for operating a semiconductor device, comprising:

generating a bit line precharge driving signal for controlling a precharge operation of a bit line;

performing the precharge operation of the bit line in response to the bit line precharge driving signal;

generating a word line control signal after the precharge operation of the bit line;

applying biases to a program word line and a read word line in response to the word line control signal; and performing a read operation of a fuse array in response to the biases applied to the program word line and the read word line.

13. The method of claim 12, wherein the generating of the bit line precharge driving signal includes:

generating a precharge control signal and an enable signal in response to a read command and a verification read command;

generating a precharge signal in response to the precharge control signal and a precharge initialization signal; and generating the bit line precharge driving signal in response to the precharge signal and a source signal.

14. The method of claim 13, further comprising:

generating a bit line selection signal for selecting the bit line in response to the precharge signal and the source signal.

15. The method of claim 13, wherein the generating of the word line control signal includes:

generating the source signal in response to the enable signal and a rupture command; and generating the word line control signal activated after the precharge operation in response to the source signal and the precharge signal.

16. The method of claim 14, wherein the performing of the read operation of the fuse array includes:

applying a read voltage to the program word line of a fuse selected based on activation of the read word line; and sensing a current flowing through a bit line coupled to a fuse of the bit line selected based on the bit line selection signal.

* * * * *